United States Patent
Cheng et al.

[11] Patent Number: 6,121,093
[45] Date of Patent: Sep. 19, 2000

[54] METHOD OF MAKING ASYMMETRICAL TRANSISTOR STRUCTURES

[75] Inventors: Peng Cheng, Campbell; Brian Doyle, Cupertino, both of Calif.

[73] Assignee: Intel Corporation, Santa Clara, Calif.

[21] Appl. No.: 09/164,446

[22] Filed: Sep. 30, 1998

[51] Int. Cl.[7] .................................................. H01L 21/336
[52] U.S. Cl. ........................ 438/286; 438/307; 438/945
[58] Field of Search .................................... 438/286, 306, 438/307, 527, 529, 595, 945

[56] References Cited

U.S. PATENT DOCUMENTS

| | | | |
|---|---|---|---|
| 5,036,017 | 7/1991 | Noda | 438/286 |
| 5,510,284 | 4/1996 | Yamauchi | 438/286 |
| 5,904,529 | 5/1999 | Gardner et al. | 438/307 |

OTHER PUBLICATIONS

F. Wang, Y. Shi, J. Liu, Y. Lu, S. Gu & Y Zheng, "High Selective Chemical Etching of Si vs. $Si_{1-x}Ge_x$ Using $NH_4OH$ Solution," J. Electrochem. Soc., vol. 144, No. 3, Mar. 1997, pp.L37–L39.

T.K. Carns, M.O. Tanner & K.L. Wang, "Chemical Etching of $Si_{1-x}Ge_x$ in $HF:H_2O_2:CH_3COOH$," J. Electrochem. Soc. vol. 142, No. 4, Apr. 1995, pp. 1260–1266.

*Primary Examiner*—Chandra Chaudhari
*Attorney, Agent, or Firm*—Blakely, Sokoloff, Taylor & Zafman LLP

[57] ABSTRACT

A method of forming an asymmetric transistor and an asymmetric transistor. The method includes patterning a first spacer material and a second spacer material over a gate electrode material on a substrate with one side of the second spacer material adjacent to a first spacer material. The gate electrode material is patterned according to the first spacer material and the second material. Junction regions are formed in the substrate adjacent to the gate electrode material. One of the first spacer material and the second spacer material is then removed and the gate electrode material is patterned into a gate electrode according to the other of the first spacer and the second spacer material. Finally, second junction regions are formed in the substrate adjacent to gate electrode.

12 Claims, 4 Drawing Sheets

METHOD OF MAKING ASYMMETRICAL TRANSISTOR STRUCTURES

BACKGROUND OF THE INVENTION

1. Field of the Invention

The invention relates to the field of integrated circuit devices and more particularly to improved scaleable transistor devices for us in high performance circuits.

2. Description of Related Art

Shallow and/or lightly doped source/drain junction structures are widely used in modern metal oxide field effect transistors (MOFETs). The shallow and/or lightly doped junction improves the hot electron reliability and reduces short channel effects, such as punch-through, Drain-Induced-Barrier-Lowering, and threshold voltage roll-off. In general, a reduction in the short channel effects also yields better gate control.

One shortcoming of the shallow and/or lightly doped source/drain junction structures is that such structures tend to increase the parasitic resistance of the junctions. An increased parasitic resistance tends to reduce the resistor drive current.

What is needed is a transistor device and a method of forming a transistor device that offers the benefits of shallow and/or lightly doped junction structures without the parasitic resistance shortcoming seen with these structures.

SUMMARY OF THE INVENTION

A method of forming a transistor and a transistor are disclosed. One aspect of the method includes patterning a first spacer material and a second spacer material over a gate electrode material on a substrate with one side of the second spacer material adjacent to the first spacer material. The gate electrode material is patterned according to the first spacer material and the second spacer material. Junction regions are formed in the substrate adjacent the gate electrode material. One of the first spacer material and the second spacer material is then removed and the gate electrode material is patterned into a gate electrode according to the other of the first spacer and the second spacer material. Second junction regions are then formed in the substrate adjacent the gate electrode.

DETAILED DESCRIPTION OF THE INVENTION

The invention relates to an asymmetric transistor device and a method of making an asymmetric transistor device. The invention recognizes that shallow or lightly doped junctions are, in many circumstances, generally only needed on one side of a transistor device to improve the device performance. For example, forming shallow doped junctions only on the drain side improves the hot electron reliability and reduces short channel effects because a high electric field region typically exists only near the drain junction and not the source junction. The invention recognizes that forming a corresponding shallow doped source junction in this configuration only increases the parasitic resistance without significantly improving the hot electron reliability and reducing short channel effects.

At saturation, where the drive current ($I_{dsat}$) theoretically remains constant as the drain voltage ($V_d$) increases, the effect of the drain parasitic resistance ($R_d$) on $I_{dsat}$ is very small. However, the effect of the source parasitic resistance ($R_s$) will reduce the effect of the gate voltage across the gate electrode and drain by $I_{dsat} \times R_s$. Thus, $R_s$ may reduce $I_{dsat}$ significantly. For example, $I_{dsat}$ in an ideal short channel MOSFET where velocity saturation dominates may be expressed by the following equation:

$$I_{dsat} = W C_{OX}(V_G - I_{dsat} R_S - V_t) V_{sat}$$

where W is the transistor width, $C_{OX}$ is the gate capacitance, $V_G$ is the gate voltage, $V_t$ is the threshold voltage, and $V_{sat}$ is the saturation velocity. It is observed from this equation that the source parasitic resistance ($R_s$) may reduce the drive current ($I_{dsat}$) significantly but the drain parasitic resistance ($R_d$) has no effect on the drive current. The invention capitalizes on this observation by forming source/drain junctions that offer reduced parasitic resistance while providing the benefits of shallow doped junctions.

Figure 1:
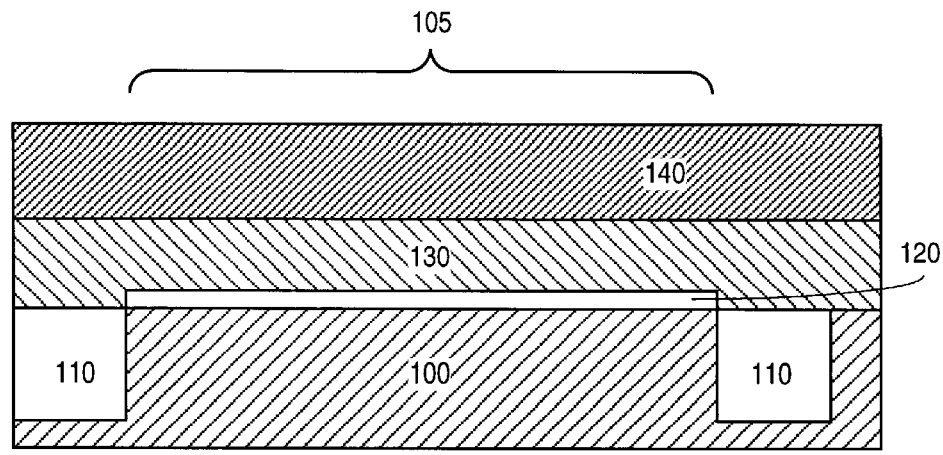
FIG. 1 is a cross-sectional planar side view of a portion of a substrate or wafer with an active area in the substrate defined by shallow trench isolation structures in accordance with an embodiment of the invention. Overlying the substrate is a gate electrode material. A first spacer material overlies the gate electrode material.
Figure 2:
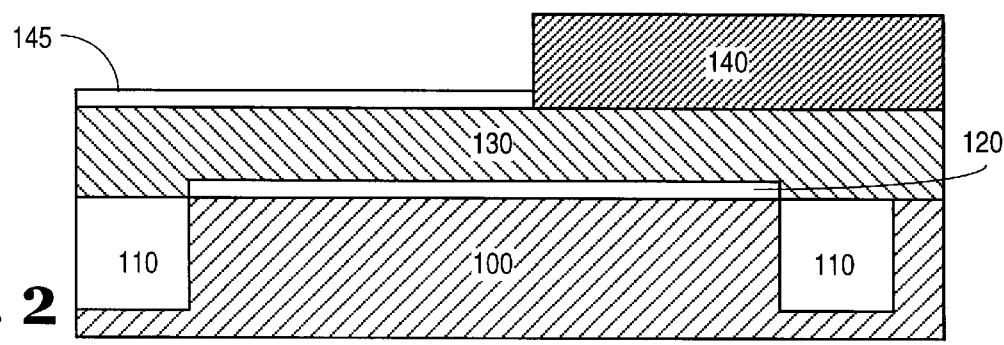
FIG. 2 shows the substrate of FIG. 1 after the further processing step of patterning the first spacer material over a portion of the gate electrode material and forming an oxide or other protective layer over the exposed gate electrode material in accordance with the embodiment of the invention.

FIG. 1 show a cross-sectional planar side view of a portion of a semiconductor substrate or wafer (hereinafter "substrate"). Substrate 100 is, for example, a silicon semiconductor substrate or an epitaxial layer of silicon. FIG. 1 shows two trench isolation structures 110 that define active area 105 of the substrate. Trench isolation structures 110 are formed according to known techniques. Active area 105 of substrate 100 may be doped, for example, by introducing boron or other suitable dopant to form a P-type well or arsenic or other suitable dopant to form an N-type well.

Overlying active area 105 of substrate 100 is dielectric layer 120 such as, for example, a thermally grown gate oxide (e.g., $SiO_2$). Overlying dielectric layer 120 is gate electrode material 130. Gate electrode material 130 is, for example, polysilicon or other gate electrode materials, including but not limited to, a conductive metal, metal silicide, or metal alloy. Gate electrode material 130 is deposited according to known techniques to a desired thickness for a gate electrode width based on performance and scaling considerations.

Overlying gate electrode material 130 in FIG. 1 is first spacer material 140. First spacer material 140 is, for example, a tetraethyl orthosilicate (TEOS) deposited oxide or plasma-enhanced chemical vapor deposited (PECVD) oxide. First spacer material 140 is deposited, in this example, to a thickness approximately equivalent to the thickness of a desired gate electrode. Depositing first spacer material 140 to a thickness of, for example, 1,000–2,000 Å would be suitable for current performance and scaling requirements. First spacer material 140 is patterned over gate electrode material 130 to define one edge or side of a gate electrode. Thus, for example, first spacer material 140 overlies a region of active area 105, that is to be a junction region (e.g., a source junction region) of a transistor formed in active area 105. First spacer layer 140 may be patterned using conventional techniques such as, in the case of an oxide, a chemical etch chemistry.

Once first spacer material 140 is deposited and patterned over a portion of gate electrode material 130, protection layer 145 is formed over the exposed portion of gate electrode material 130. Protection layer 145 is, for example, a thermally grown oxide on the order of 100–200 Å. Protection layer 145 serves, in one aspect, to protect the exposed portion of gate electrode material 130 during subsequent patterning steps.

Figure 3:
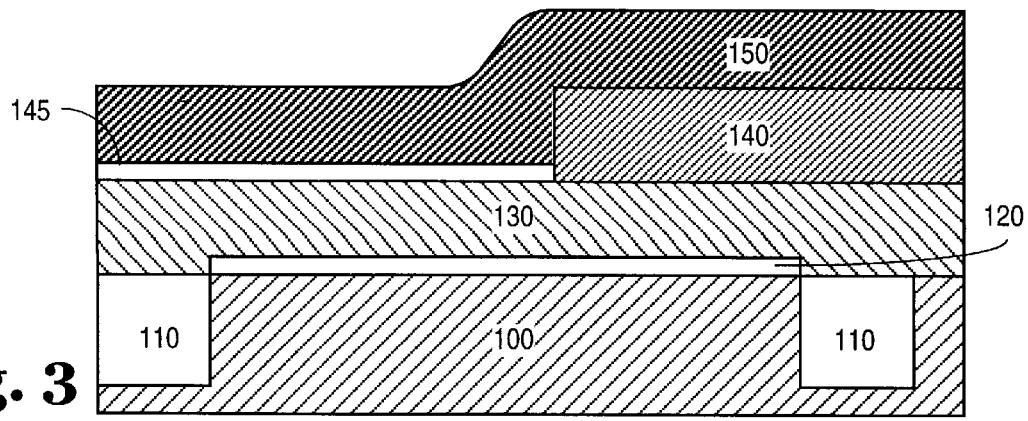
FIG. 3 shows the substrate of FIG. 1 after the further processing step of conformally depositing a second spacer material over the substrate in accordance with an embodiment of the invention.
Figure 4:
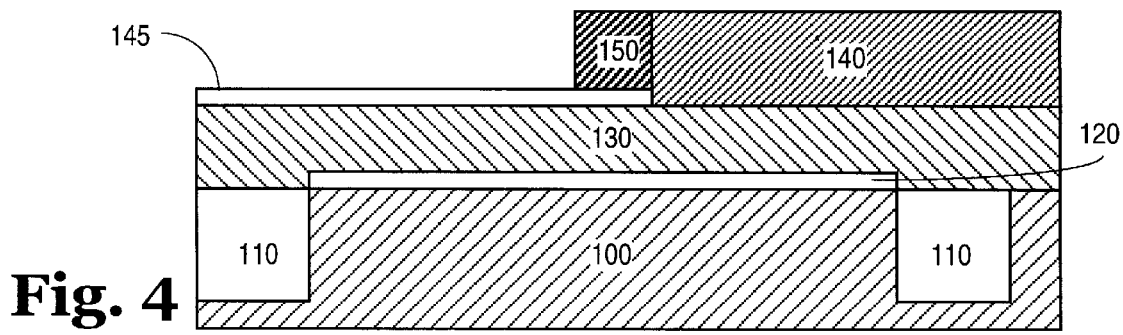
FIG. 4 shows the substrate of FIG. 1 after the further processing step of patterning the second spacer material adjacent the first spacer material in accordance with an embodiment of the invention.

FIG. 3 shows substrate 100 after the further processing step of conformally depositing second spacer material 150. Second spacer material 150 is, for example, silicon nitride ($Si_3N_4$). In one embodiment, second spacer material 150 is deposited to a thickness of approximately the desired gate length including the thickness of protection layer 145. An example of a suitable thickness of conformally deposited second spacer material 150 based on current gate length, performance and scaling considerations is in the range of 500–1500 Å.

After the conformal deposition of second spacer material 150, second spacer material 150 is patterned to define an area over gate electrode material 130 commensurate with a desired gate electrode width. Thus, in one embodiment, the width of patterned second spacer material 150 determines a subsequent gate electrode width and the thickness of patterned second spacer material 150 determines a desired gate electrode length. As will be apparent from the description that follows, the patterning of first spacer material 140 and second spacer material 150 commensurate with a desired gate electrode length is provided only as a deposition guideline. The thickness of the deposition may vary, perhaps considerably, without deviating from the spirit and scope of the invention. The patterning of second spacer material 150 may be done using a chemical etch such as, for example, a $CF_4/O_2$ etch chemistry.

Figure 5:
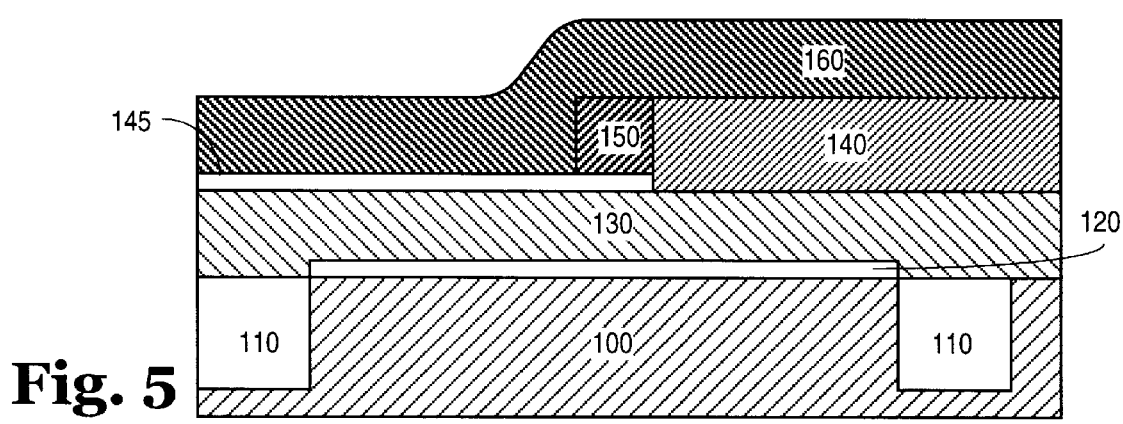
FIG. 5 shows the substrate of FIG. 1 after the further processing step of conformally depositing a third spacer material over the substrate in accordance with an embodiment of the invention.
Figure 6:
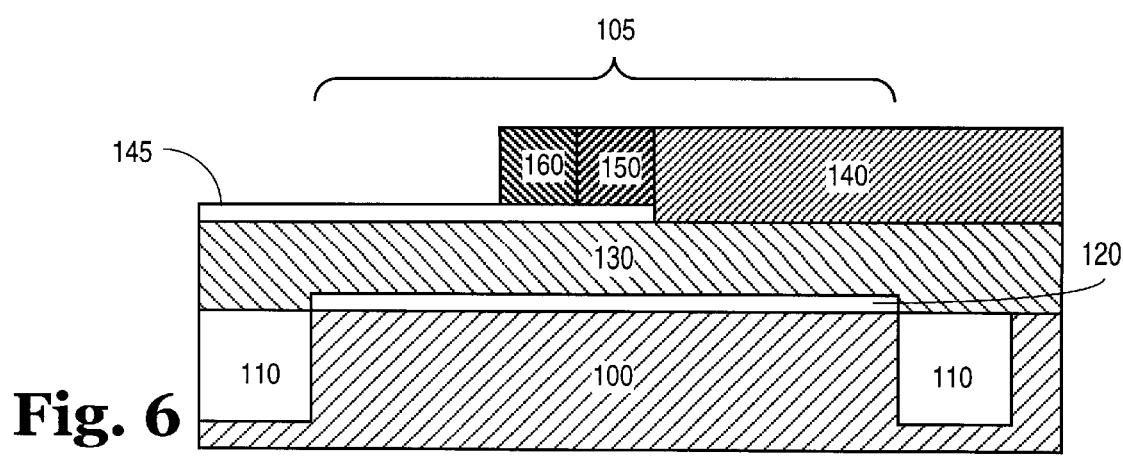
FIG. 6 shows the substrate of FIG. 1 after the further processing step of patterning the third spacer material adjacent the second spacer material in accordance with an embodiment of the invention.

FIG. 5 shows the portion of the substrate after the further processing step of conformally depositing third spacer material 160. Third spacer material 160 is chosen such that its patterning properties, such as for example, its etch patterning properties are sufficiently different from the patterning properties of second spacer material 150. In the example where second spacer material 150 is $Si_3N_4$, third spacer material 160 is a material that may be selectively patterned, for example selectively etched, in the presence of $Si_3N_4$. Silicon germanium (SiGe) is one suitable material. In this embodiment, third spacer material 160, such as for example SiGe, is conformally deposited to a thickness of approximately the thickness of second spacer material 150—approximately the thickness of a desired gate electrode length. Again, the thickness of the deposition may vary without deviating from the spirit of the invention.

In the embodiment where second spacer material 150 is patterned to define an area over gate electrode material 130 that defines the dimensions of a gate electrode and first spacer material 140 defines an area over active area 105 that is a junction region, third spacer material 160 is patterned to define an area over active area 105 that is to be a portion of a second junction region such as a portion of a drain junction of a subsequent transistor formed in active area 105. Specifically, third spacer material 160 is patterned of a width to define a tip area of a subsequent junction region in active area 105 of substrate 100.

Figure 7:
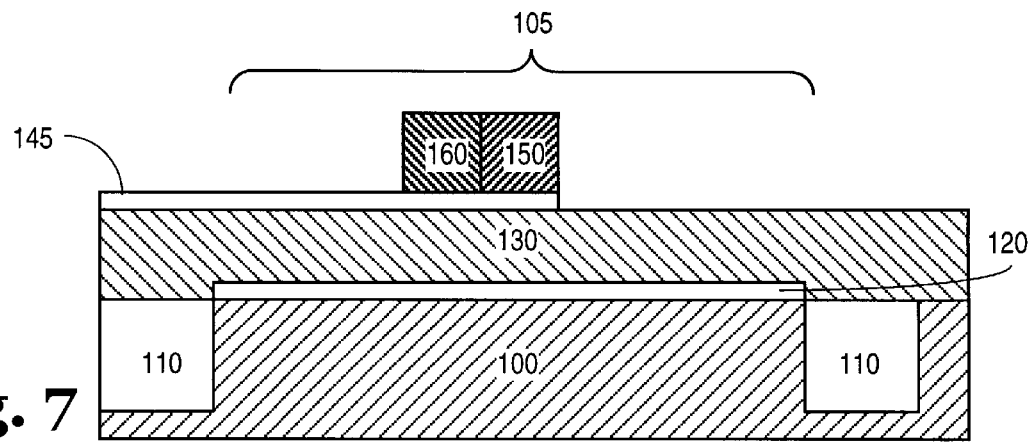
FIG. 7 shows the substrate of FIG. 1 after the further processing step of removing the first spacer material in accordance with an embodiment of the invention.

FIG. 7 shows the substrate after the further processing step of removing first spacer material 140 to expose a portion of gate electrode material 130. In the embodiment where first spacer material 140 is $SiO_2$, first spacer material layer 140 may be removed by a conventional etch utilizing, for example a hydrofluoric acid etch chemistry.

Figure 8:
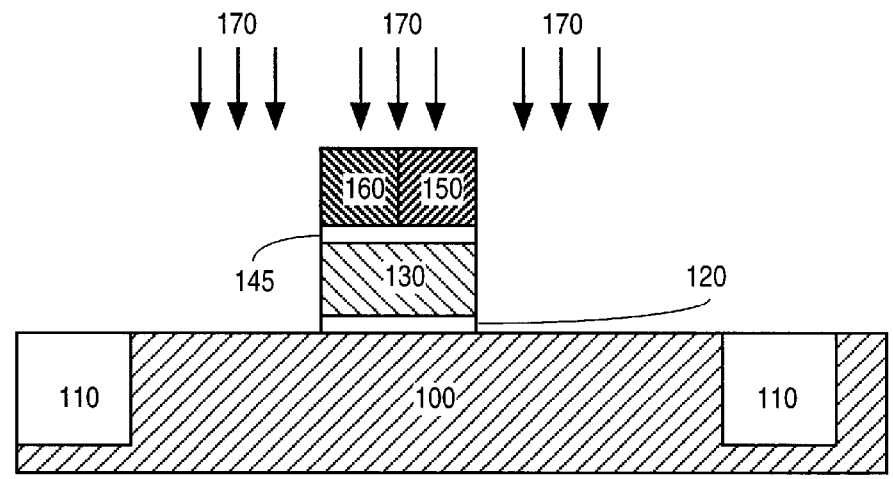
FIG. 8 shows the substrate of FIG. 1 after the further processing step of patterning the gate electrode material according to the patterned second spacer material and third spacer material and shows the subsequent processing step of introducing a dopant into the substrate to form first junction regions in accordance with an embodiment of the invention.

FIG. 8 shows the substrate after the further processing step of a first patterning of gate electrode material 130. In FIG. 8, patterned second spacer material 150 and patterned third spacer material 160 protect an area above gate electrode material 130 and gate electrode material is removed from active area 105 in all unprotected areas. In the example where gate electrode material 130 is polysilicon, the exposed portions of gate electrode material 130 may be removed by an etch, such as for example, using a $CF_4$ etch chemistry.

Once gate electrode material 130 is patterned a first time, FIG. 8 shows the subsequent processing step of introducing a dopant into substrate 100 to form junction regions adjacent remaining gate electrode material 130. To form, for example, a P-type transistor, a dopant such as boron is introduced into substrate 100. In the case of forming an N-type transistor, a dopant such as arsenic is introduced into substrate 100. In this embodiment, the introduction of dopant 170 into substrate 100 seeks to form what are commonly referred to as "deep" junction zones. Thus, the dopant, whether arsenic or boron or other suitable dopants are introduced to a depth of, for example, 2,000–3,000 Å depending upon current device scaling considerations.

Figure 9:
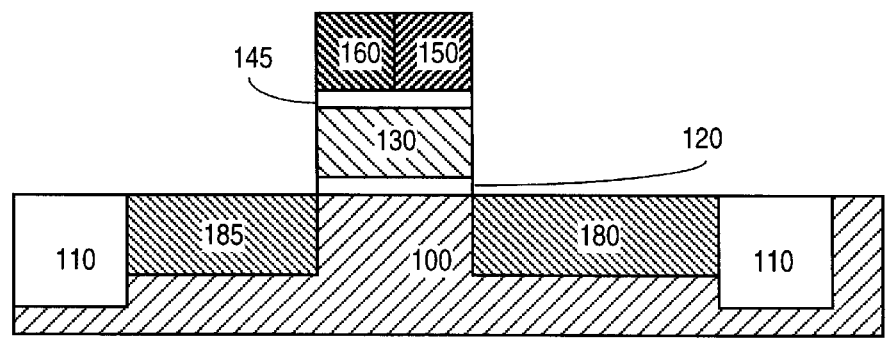
FIG. 9 shows the substrate of FIG. 1 after the further processing step of forming first junction regions in the substrate adjacent the second spacer material and third spacer material in accordance with an embodiment of the invention.

FIG. 9 shows the substrate after the formation of deep junction zones 180 and 185 in substrate 100. In this embodiment, deep junction zones 180 and 185 are substantially aligned in substrate 100 adjacent each side of patterned gate electrode material 130.

Figure 10:
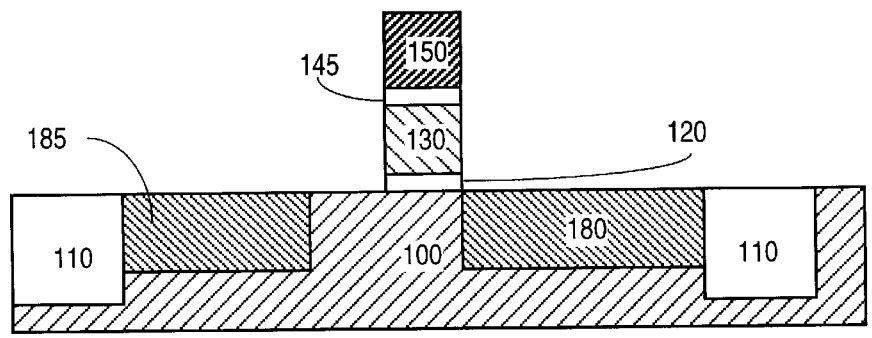
FIG. 10 shows the substrate of FIG. 1 after the further processing step of patterning the gate electrode material into a gate electrode using the second spacer material as a pattern in accordance with an embodiment of the invention.

FIG. 10 shows the substrate after the further processing step of removing one of second spacer material 150 and third spacer material 160. In FIG. 10, third spacer material 160 is removed. Third spacer material 160 is selectively removed such that second spacer material 150 remains over a portion of gate electrode material 130 to serve as a mask to define a gate electrode. In the embodiment where third spacer material 160 is SiGe and second spacer material 150 is $Si_3N_4$, a suitable etchant to selectively etch SiGe is a hydrofluoric acid, hydrogen peroxide, and acetic acid etch chemistry. Protection layer 145 will also be removed during this step.

Figure 11:
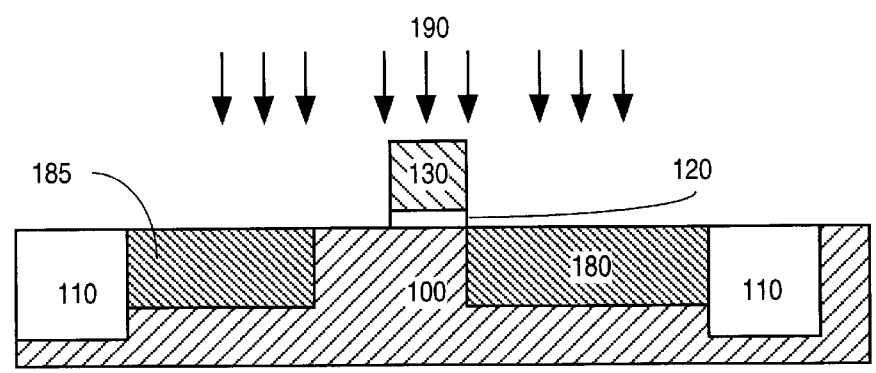
FIG. 11 shows the substrate of FIG. 1 after the further processing step of removing the second spacer material and underlying protective layer, and the subsequent processing step of introducing a dopant into a substrate to form second junction regions in accordance with an embodiment of the invention.

The removal of third spacer material 130 and underlying protection layer 145 exposes a portion of gate electrode material 130. Once third spacer material 160 is removed, the exposed portion of gate electrode material 130 is removed by, for example, a vertical or anisotropic etch of the substrate to remove the exposed gate electrode material and define a gate electrode overlying active area 105 of the substrate. At this point, second spacer material 150 may be removed along with protection layer 145 to expose the top surface of gate electrode 130. Once a gate electrode is defined and exposed, a second introduction of a dopant into substrate 100 is performed to form a "shallow" junction zone or tip. FIG. 11 illustrates the introduction of dopant 190 into substrate 100. In one embodiment, dopant 190 is similar to dopant 170. For example, in the case of a P-type transistor, a dopant such as boron is introduced while in the case of an N-type transistor a dopant such as arsenic is used. In certain circumstances, including this embodiment, it is desirous to introduce the dopant into the gate electrode material. Thus, FIG. 11 shows dopant 190 being introduced into gate electrode 130. In situations where it is not desirous to introduce dopant into the gate electrode, second spacer material 150 may be left over the gate electrode until after the second doping step.

Figure 12:
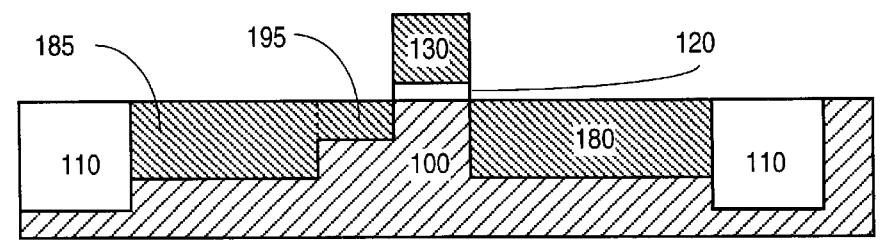
FIG. 12 shows the substrate of FIG. 1 after the further processing step of forming a second junction region adjacent one side of the gate electrode in accordance with an embodiment of the invention.

As can be seen in FIG. 12, the introduction of second dopant 190 forms a shallow junction zone or tip in active area 105 of substrate 100 adjacent to one side of defined gate electrode 130. Thus, the depth of the doping is, for example, approximately 500 Å into substrate 100 according to current device scaling considerations. It is to be appreciated that as transistors are scaled to smaller dimensions, the depth of both the deep junction zone and the shallow junction zone or tip doping will vary. In the embodiment described, the shallow junction zone is formed on the drain junction side of active area 105. On the other side of gate electrode 130, for the source junction side, dopant 190 is added to the previously formed deep junction.

FIG. 12 shows the substrate after the definition of junction regions in substrate 100. FIG. 12 shows for example source junction region 180 defined throughout as a deep junction. This follows because the introduction of dopant 190 will have little impact on source junction 180. FIG. 12 shows a drain region made up of shallow junction zone or tip 195 adjacent gate electrode 130 and deep junction zone 185 adjacent shallow junction 195. Thus, a transistor with asymmetric source and drain junctions is produced.

The above embodiment described the formation of a gate electrode beneath second spacer material 150 and an asymmetric junction formed with a drain junction having both a shallow junction zone and a deep junction zone and a source junction having only a deep junction zone. The benefit of this structure is that the hot electron reliability and short channel effects may be improved (drain junction side) and the parasitic resistance of the transistor device may be reduced and the transistor drive improved (source junction side). It is to be appreciated that the process may be reversed with the source side seeing the distinct junction zones. It is also to be appreciated that using the above techniques, the separate junctions of an individual transistor may be individualized according to the desired properties of the device. The method of the invention provides the control to individually modify each junction of a transistor. Further, it is also to be appreciated that the deposition and patterning steps of the spacer materials may be modified, for example, reversing the etch and removal of second spacer material 150 and third spacer material 160 to modify the formation of the transistor device without deviating from the spirit of the invention. Finally, the modifiers used to describe the spacer materials (first, second, third) refer only to the order in which the deposition steps occurred in this particular embodiment of a method of the invention and are not intended to limit the invention.

In the preceding detailed description, the invention is described with reference to specific exemplary embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of forming a transistor comprising:
   patterning a first spacer material and a second spacer material over a gate electrode material on a substrate, a side of the second spacer material adjacent the first spacer material;
   patterning the gate electrode material according to the first spacer material and the second spacer material;
   forming first junction regions in the substrate adjacent the gate electrode material;
   removing one of the first spacer material and the second spacer material;
   patterning the gate electrode material into a gate electrode according to the other of the first spacer material and the second spacer material; and
   forming second junction regions in the substrate adjacent the gate electrode.

2. The method of claim 1, wherein the first spacer material defines the pattern for the gate electrode and wherein the second spacer material is adjacent a first side of the first spacer material and the method comprises:
   prior to patterning the first spacer material and the second spacer material, patterning a third spacer material adjacent a second side of the first spacer material; and
   after patterning the first spacer material and the second spacer material, removing the third spacer material.

3. The method of claim 2, wherein the first junction region formed in the substrate adjacent the first side of the first spacer material is a source junction region.

4. The method of claim 3, wherein forming a second junction region on the first side of the first spacer material comprises forming the second junction region inside the first junction region.

5. The method of claim 1, wherein forming the first junction regions and the second junction regions comprises introducing a dopant into the substrate, and the depth of the dopant introduced in forming the first junction regions is greater than the depth of the dopant introduced in forming the second junction regions.

6. The method of claim 1, wherein the first spacer material and the second spacer material are patterned by etch patterning and the second spacer material may be selectively etched in the presence of the first spacer material.

7. The method of claim 2, after patterning the gate electrode material into a gate electrode, further comprising removing the first spacer material.

8. A method of forming a transistor comprising:

patterning a first spacer material over a gate electrode material on a substrate;

patterning a second spacer material over the gate electrode material, a first side of the second spacer material adjacent the first spacer material;

patterning a third spacer material adjacent a second side of the second spacer material;

removing the first spacer material;

patterning the gate electrode material according to the second spacer material and the third spacer material;

forming first junction regions in the substrate adjacent the gate electrode material;

removing the third spacer material;

patterning the gate electrode material into a gate electrode according to the second spacer material; and forming second junction regions in the substrate adjacent the gate electrode.

9. The method of claim 8, wherein the junction region formed in the substrate adjacent the first side of the second spacer material is a source junction region.

10. The method of claim 9, wherein forming a second junction region on the first side of the second spacer material comprises forming the second junction region inside the first junction region.

11. The method of claim 9, wherein forming a second junction region on the first side of the second spacer material comprises forming the second junction region inside the first junction region.

12. The method of claim 8, wherein the second spacer material and the third spacer material are patterned by etch patterning and the third spacer material may be selectively etched in the presence of the second spacer material.

* * * * *